US005150043A

United States Patent [19]
Flesner

[11] Patent Number: 5,150,043
[45] Date of Patent: Sep. 22, 1992

[54] APPARATUS AND METHOD FOR NON-CONTACT SURFACE VOLTAGE PROBING BY SCANNING PHOTOELECTRON EMISSION

[75] Inventor: Larry D. Flesner, San Diego, Calif.

[73] Assignee: The United States of America as represented by the Secretary of the Navy, Washington, D.C.

[21] Appl. No.: 653,829

[22] Filed: Feb. 11, 1991

[51] Int. Cl.$^5$ .................................................. G01R 31/00
[52] U.S. Cl. ..................................... 324/158 R; 324/96; 324/158 D
[58] Field of Search .................. 324/158 R, 158 D, 96; 356/389, 237

[56] References Cited

U.S. PATENT DOCUMENTS

| 4,656,419 | 4/1987 | Garlick | 324/158 D |
| 4,695,794 | 9/1987 | Bargett et al. | 324/158 R |
| 4,736,159 | 4/1988 | Shiragasama et al. | 324/158 D |
| 4,868,492 | 9/1989 | Beha et al. | 324/158 R |
| 4,885,534 | 12/1989 | Eck et al. | 324/158 D |
| 4,893,932 | 1/1990 | Knollenberg | 356/237 |
| 4,902,967 | 2/1990 | Flesner | 324/158 D |
| 4,906,922 | 3/1990 | Takahashi et al. | 324/158 R |
| 4,967,152 | 10/1990 | Patterson | 324/96 |

OTHER PUBLICATIONS

"Picosecond Photoelectron Scanning Electron Microscope for Testing of Integrated Circuits", by May et al, applied Phys. Lett., vol. 51, #2, Jul. 13, 1987, pp. 145-147.

Primary Examiner—Ernest F. Karlsen
Assistant Examiner—William J. Burns
Attorney, Agent, or Firm—Harvey Fendelman; Thomas Glenn Keough; Michael A. Kagan

[57] ABSTRACT

An apparatus and method for non-contact sensing electrical potentials of selected regions on the surface of a sample are provided. A typical sample is an integrated circuit, electronic device, or semiconductor material. The sample is positioned within a vacuum chamber and irradiated with an ultraviolet light beam so that the material emits electrons by the photoelectric effect. The electrons have kinetic energies which are variable according to the electrical potential of the surface of the material. Emitted electrons having kinetic energies within a predetermined range are selected by an electron energy analyzer. An electron detector receives the selected electrons and produces electrical signals corresponding to the energies of said selected electrons. In another embodiment of the invention, a modulated light beam other than the ultraviolet light probe beam irradiates the material in order to produce time varying modulation of the photoelectron energy spectrum.

6 Claims, 1 Drawing Sheet

APPARATUS AND METHOD FOR NON-CONTACT SURFACE VOLTAGE PROBING BY SCANNING PHOTOELECTRON EMISSION

STATEMENT OF GOVERNMENT INTEREST

The invention described herein may be manufactured and used by or for the Government of the United States of America for governmental purposes without the payment of any royalties thereon or therefor.

BACKGROUND OF INVENTION

The present invention relates to the field of non-contact probing of surface voltages of electrical circuits, devices and materials such as semiconductors. More specifically, the invention is related to scanning photoelectron emission microscopy as described in the *Journal of Electron Spectroscopy and Related Phenomena*, Vol. 52 (1990), pp. 811–819, in an article by Rotermund, et. al. It is also related to "Picosecond Photoelectron Scanning Electron Microscope for Noncontact Testing of Integrated Circuits" by P. May, et. al, published in *Applied Physics Letters*, Vol. 51, No. 2, of Jul. 13, 1987.

In the fabrication of semiconductor circuits it is useful to probe the electrical potential at various locations on a semiconductor sample. The most direct means for doing this is to make electrical contact at a location by means of a physical contact probe. This approach is frequently impractical because the location to be tested is not readily accessible. Contactless voltage measurement techniques offer the advantage of not requiring physical contact to the test sample. A specific application for which contactless voltage measurement is useful is in the development of photodetector arrays where it is desirable to determine whether all individual detectors are functioning after an array is delineated and prior to further processing.

One method of making non-contact voltage measurements is to use an electron-beam as a probe. U.S. Pat. No. 4,902,967, "Scanning Electron Emission by Photovoltage Contrast Imaging," describes an application of electron-beam voltage probing in conjunction with photomodulation of the sample surface voltages. This technique can be used to test photodetector arrays by observing voltage changes as the photodetectors are illuminated. However, there are limitations to the use of electron beam probing for this application. First, the electron beam generates charge carriers in semiconductor materials which can compete with the photomodulation effect that is to be observed. Second, the electron beam can induce permanent charge trapping in insulating layers on some samples which damages the sample under test. Third, the voltage resolution of the electron beam technique is reduced by the energy spread of the secondary electrons, and the resolution may be inadequate for some applications. Fourth, the electron beam can cause alterations in surface contamination layers, adversely affecting the voltage measurements. Therefore, there is a need for a non-contact method for testing the voltage characteristics of semiconductor devices that avoids the aforementioned problems associated with non-contact techniques employing an electron beam.

SUMMARY OF THE INVENTION

An apparatus and non-contact method for probing the electrical potential on the surface of a material such as a semiconductor are provided. The material is positioned within a vacuum chamber and irradiated with an ultraviolet light beam so that the material emits electrons as a result of the photoelectric effect. The photoelectrons have kinetic energies which are variable according to variations in electrical potential of the material surfaces from which they originate. Emitted electrons having kinetic energies within a predetermined range are selected by an electron energy analyzer. An electron detector receives the selected electrons and produces electrical signals corresponding to the number of electrons possessing said energies. In another embodiment of the invention, a modulated light beam irradiates the material in order to produce time varying modulation of the selected photoelectrons.

The advantages of using photoelectron emission to probe the electrical potential of a material are several. First, the UV light can be made of sufficiently short wavelength so that it has negligible penetration into the material. This minimizes production of unwanted charge carriers in materials such as semiconductors, and reduces damage effects to insulating layers. Second, the relatively low energy of the UV excitation also minimizes alterations in surface contaminants which can cause contamination problems associated with electron-beam probing. Third, the energy spread of photoemitted electrons is orders of magnitude smaller than the energy spread of secondary electrons produced by a primary electron beam. Typically, the photoelectron energy spread will be less than one electron volt if the UV photon energy is less than 6 electron volts. This compares to an energy spread of tens of electron volts for secondary electron emission. The reduced energy spread facilitates more accurate energy analysis with correspondingly improved voltage resolution. The present invention is expected to be particularly suitable for providing quality assurance during the manufacture of imaging focal plane arrays, in particular high resolution arrays and long wavelength infrared detector arrays.

DESCRIPTION OF THE PREFERRED EMBODIMENT

Figure 1:
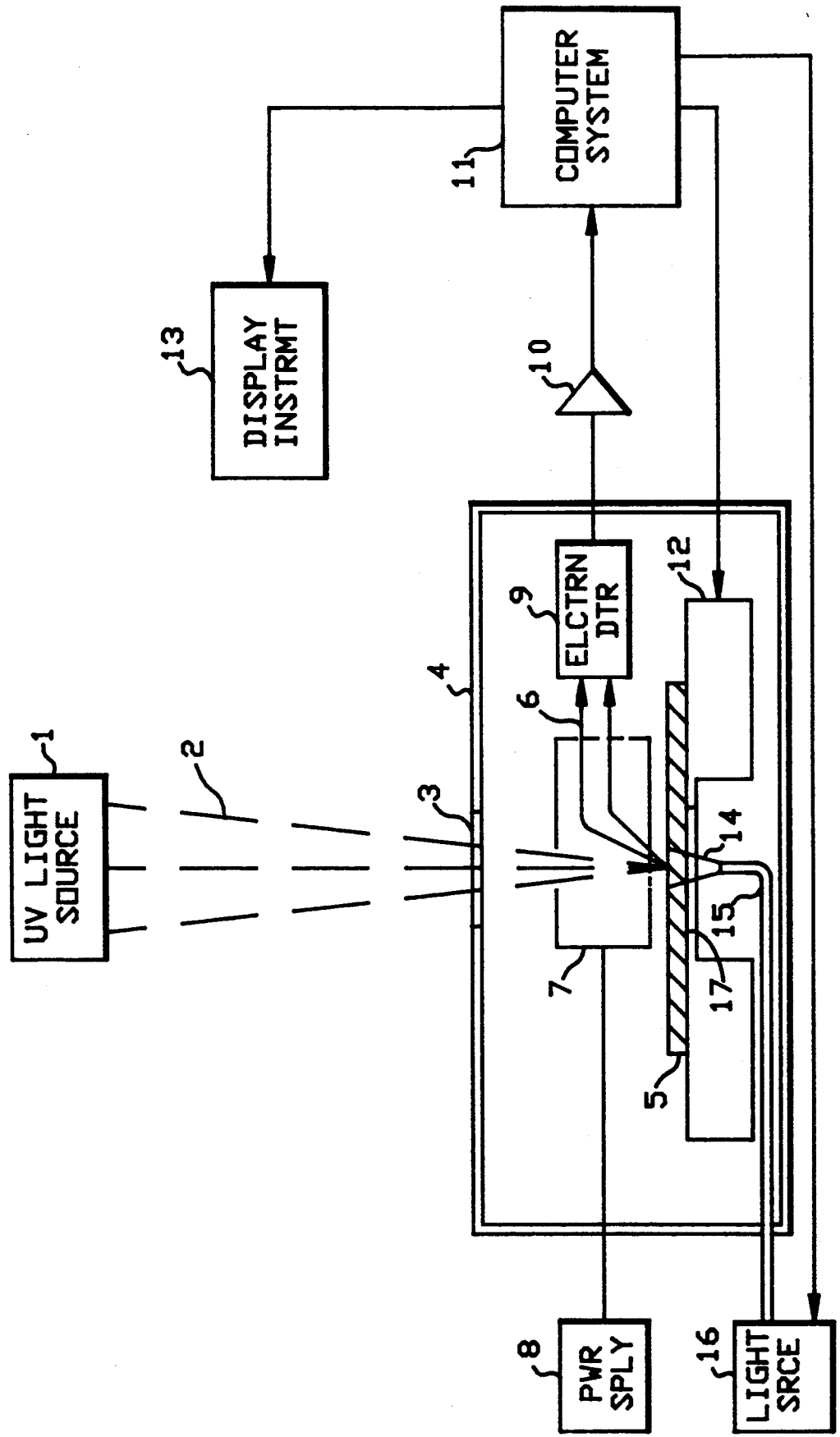
FIG. 1 is a diagram of an apparatus for implementing the present invention.

Referring to FIG. 1, ultraviolet light source 1 produces a UV light beam 2 which is propagated through UV transparent window 3 into vacuum chamber 4. The wavelength of the UV light beam 2 is chosen so that significant numbers of photoelectrons will be emitted from the test sample 5. UV light beam 2 is focused onto a small area of test sample 5 which is typically fabricated from a semiconducting material. Techniques for producing focused UV light beams are well known [See Rotermund, supra; May, supra].

UV light beam 2 causes photoelectrons 6 to be emitted from the surface of test sample 5 by the well known photoelectric effect phenomenon. Photoelectrons 6 are collected by an applied electric field and selected according to their kinetic energy by electron energy analyzer 7. Electron energy analyzers are well known and commercially available in electron probing systems from ISI Corporation, Schlumberger, and others. The required bias voltages for the energy analyzer 7 are provided by power supply 8. The energy selected electrons 6 which emerge from energy analyzer 7 are subsequently detected by electron detector 9, which may be an Everhart-Thornley detector, a micro-channel plate, or other suitable electron detector. The output electrical signal from the electron detector 9 is suitably amplified and filtered by amplifier 10 and provided to an analog-to-digital converter incorporated within computer system 11, which includes a digital data processor. Computer system 11 stores the output signal, and controls the location where UV light beam 2 irradiates sample 5.

Electron detector 9 is a signal generating means which produces an electrical signal corresponding to the number of detected electrons. The number of detected electrons is functionally related to the kinetic energy spectrum of the photoemitted electrons. Optionally, negative feedback control of the energy analyzer 7 may be employed, as would be well known by those skilled in this technology. This has the advantage of providing an electrical signal which is linearly related to the kinetic energy spectrum of the photoemitted electrons.

One means of directing UV light beam 2 onto specific regions of sample 5 is to control the motion of motorized X- translation stage 12, upon which sample 5 is mounted. Stage 12 may be controlled by computer system 11. By moving sample 5 in a two-dimensional scan pattern via stage 12, a map of the output signal versus sample location can be stored by computer system 11 for subsequent analysis or display. Sample stage 12 may also include systems to control the temperature of sample 5. Temperature control is important because many detector arrays function properly only within a certain range of temperatures.

In addition to imaging the variation in output signal from detector 9 as a function of sample position as described above, it may also be desirable to record the effect of photomodulation on the sample surface voltages, as for example, when performing measurements on photodetector arrays. The light beam used to measure the effect of photomodulation is different from the focused UV light beam 2 which is used to generate photoelectron emission from the surface of sample 5. Typically, the light beam used for photomodulation has a longer wavelength than that of the ultraviolet light beam. The longer wavelength is more effective at modulating the sample electrical response than would be a beam having a shorter wavelength, as explained in the example which follows.

For purposes of illustration, by way of example, a detector array fabricated on a silicon wafer can be illuminated by light with about 1.2 electron volt photon energy for efficient electrical response. Such illumination will both penetrate through a typical silicon wafer and excite charge carriers as it propagates through the sample. In contrast, the UV photon energy will be on the order of 5-6 electron volts, and it will have very shallow penetration below the silicon surface. Because of the shallow penetration and because the UV light is focused onto a small area of the structure being examined, the UV light is not efficient at producing an electronic response in typical photodetectors. In some cases additional layers of material on the test sample surface may even prevent the UV light from reaching the optically sensitive regions of the sample. The photomodulation light can usually be propagated through the sample from below as shown, by way of example, in FIG. 1, and described below.

Light source 16, such as a Nd-YAG laser with 1.06 micrometer wavelength output, is coupled into optical light guide 15. Light source 16 is selected such that its output has a wavelength and intensity suitable for a particular application. The light output of source 16 is modulated as a function of time. This can be done by controlling the laser pump power. In the preferred embodiment, the modulation of the output of light source 16 is controlled by computer system 11. Light beam 14, emitted from the light guide below sample 5, produces time varying photomodulation of the potential at the surface of sample 5. The effects of the photomodulation are then detected as variations in the signal that is output by detector 9.

Computer system 11 records the photomodulation induced signal variations as a function of sample position. For example, the UV light probe can be moved from photodetector to photodetector in an array. Bad photodetectors will respond differently than will good ones. Many photodetector arrays are designed for illumination through the substrates, and thus the system for testing the effects of photomodulation, shown in FIG. 1, has very widespread utility. The signal variations provided by detector 9 that are stored in computer system 11 can be displayed by display instrument 13, which may be a cathode ray tube, printer or other display instrument.

Stage 12 moves translates sample 5 relative to the light beams 2 and 14, which do not move in the embodiment illustrated, in order to selectively illuminate different areas of sample 5. However, the scope of the invention further comprehends incorporating suitable means for separately directing UV light beam 2 and light beam 14 across sample 5, while sample 5 remains stationary. Transparent area 17 in stage 12 allows light beam 14 to irradiate sample 5. However, it is to be understood that photomodulation from a position above the sample may also be practiced, although light source 16 must be positioned so as not to interfere with the collection of photoelectrons 6 from sample 5.

In addition to measuring voltage variations as a function of position and/or photomodulation, it is also possible to measure repetitive time dependent voltage waveforms on a surface by applying the well known "sampling" technique with the apparatus described above. For this type of measurement, UV light beam 2 may be pulsed for brief periods at intervals synchronized with the waveform to be observed. By selectively varying the time within the waveform interval at which the light pulse is applied, the waveform can be "scanned" in time and recorded. Systems for producing synchronized pulses of UV light are well known.

Obviously, many modifications and variations of the present invention are possible in light of the above teachings. It is therefore to be understood that within the scope of the appended claims, the invention may be practiced otherwise than as specifically described.

I claim:

1. An apparatus for sensing the electrical potential on the surface of a material, comprising:
    a vacuum chamber in which the material is positioned;
    an ultraviolet light source for irradiating a first surface of the material with an ultraviolet beam so that the material emits electrons having kinetic energies which are variable according to the electrical potential of said first surface of the material;

first means positioned to irradiate a second surface of the material, different than said first surface, with a modulated light beam for producing photovoltaic effects in the material; and second means positioned to receive said emitted electrons for displaying data corresponding to said emitted electrons having kinetic energies within a predetermined range.

2. The apparatus of claim 1, wherein said first means includes:

a Nd-YAG laser for generating said modulated light beam.

3. The apparatus of claim 2, wherein said first means further includes:

an optical fiber positioned to receive said modulated light beam from said Nd-YAG laser and emit said modulated light beam so as to illuminate selected regions of said material.

4. A non-contact method for sensing photovoltaic effects on the surface of a material, comprising the steps of:

irradiating a selected first region of the material with an ultraviolet light beam so that the material emits electrons having kinetic energies which are variable according to the electrical potential of the sample surface, said sample surface being positioned within a vacuum chamber;

irradiating a selected second region of the material with a modulated light beam to produce photovoltaic effects in the material while simultaneously irradiating the material with said ultraviolet light beam, said modulated beam having a wavelength longer than the wavelength of said ultraviolet light beam;

selecting electrons having kinetic energies within a predetermined range; and producing electrical signals corresponding to the energies of said selected electrons.

5. The method of claim 4 wherein:

said first region of said material is on a first surface of said material; and said second region of said material is on a second surface of said material, said second surface being different than said first surface.

6. The method of claim 5 further including:

propagating said modulated beam through an optical light guide.

* * * * *